United States Patent
Shakeshaft et al.

(10) Patent No.: US 6,980,779 B2
(45) Date of Patent: *Dec. 27, 2005

(54) RF TRANSMITTER USING DIGITAL-TO-RF CONVERSION

(75) Inventors: Niall Eric Shakeshaft, Helsinki (FI); Jussi Heikki Vepsäläinen, Helsinki (FI); Petri Tapani Eloranta, Espoo (FI); Pauli Mikael Seppinen, Espoo (FI)

(73) Assignee: Nokia Corporation, Espoo (FI)

( * ) Notice: Subject to any disclaimer, the term of this patent is extended or adjusted under 35 U.S.C. 154(b) by 0 days.

This patent is subject to a terminal disclaimer.

(21) Appl. No.: 10/988,202

(22) Filed: Nov. 12, 2004

(65) Prior Publication Data

US 2005/0111573 A1    May 26, 2005

Related U.S. Application Data

(63) Continuation-in-part of application No. 10/717,986, filed on Nov. 20, 2003.

(51) Int. Cl.[7] .............................................. H04B 1/04
(52) U.S. Cl. ...................... 455/127; 455/333; 455/323; 455/296; 455/313; 455/318; 375/150; 327/113; 327/100; 332/103
(58) Field of Search ........................ 375/150; 327/100, 327/113; 455/333, 323, 296, 313, 318; 332/103

(56) References Cited

U.S. PATENT DOCUMENTS 4,088,905 A * 5/1978 Comer .......................... 327/72
5,448,772 A * 9/1995 Grandfield .................. 455/333
6,545,516 B2 * 4/2003 Ylamurto et al. ........... 327/113

FOREIGN PATENT DOCUMENTS

EP       1338085        8/2003
WO     WO 02/37667      5/2002

OTHER PUBLICATIONS

IEEE Journal of Solid-State Circuits 0018-9200/02, vol. 37, No. 9; Gutierrez-Aitken et al.; "Ultrahigh-Speed Direct Digital Synthesizer Using InP DHBT Technology"; pp. 1115-1119; Sep. 2002.
IEEE 2001 Custom Integrated Circuits Conference 0/7803/6591-7/01; Splett et al.; "Solutions for highly integrated future generation software radio basestation transceivers"; pp. 511-518; 2001.
IEEE 0-7803-3625-9/96; Koli et al.; "Current-Mode Up-Converting D/A-Interface for Mobile Communication Transmitter Applications"; pp. 20-24; 1996.
IEEE 0018-9200/03; Zhou et al.; "A 10-Bit Wide-Band CMOS Direct Digital RF Amplitude Modulator"; pp. 1182-1188; 2003.

* cited by examiner

*Primary Examiner*—Shuwang Liu
*Assistant Examiner*—Sudhanshu C. Pathak
(74) *Attorney, Agent, or Firm*—Ware, Fressola, Van Der Sluys & Adolphson LLP

(57) ABSTRACT

An RF transmitter having two digital to RF-conversion devices that combine the D/A conversion function and the upconversion function by a RF-carrier or IF-signal. The device comprises a plurality of parallel unit cells, each of which is a mixer cell type converter having a differential data switch section connected in series to a differential LO-switch pair. The differential LO-switch is further connected in series to a current source. Each unit cell is adapted to receive a control voltage indicative of a data signal value.

8 Claims, 8 Drawing Sheets

RF TRANSMITTER USING DIGITAL-TO-RF CONVERSION

This is a Continuation-In-Part application of and claiming priority to a co-pending U.S. patent application Ser. No. 10/717,986, filed Nov. 20, 2003, assigned to the assignee of the instant application.

FIELD OF THE INVENTION

The present invention relates generally to a digital-to-analog converter and, more particularly, to a digital-to-analog converter for use in RF signal generation.

BACKGROUND OF THE INVENTION

In radio communication applications the designs are continuously aiming for simpler and cheaper radio architectures to increase integration level of the mobile terminals. Conventionally, a direct upconversion transmitter has at least an I/Q modulator, an RF mixer, a filter and a power amplifier. The I/Q modulator is an efficient way to generate phase-modulated signals. It relies on two orthogonal signals, I (in-phase) and Q (quadrature), to produce a signal complex waveform. In a direct upconversion the I/Q modulator transforms the frequency spectrum of each orthogonal input signal to the RF carrier frequency. As such, two digital-to-analog (D/A) converters are needed to transform a digital baseband into an analog baseband, as shown in FIG. 1a. In such a conventional direct upconversion transmitter, baseband digital data is resolved into in-phase and quadrature components. These data streams are then converted into analog, lowpass, baseband signals using separate digital-to-analog converters. These quantized, analog signals are then filtered by low-pass reconstruction filters in order to remove copies of the signals centered at harmonics of the baseband clock frequency. The filtered analog signals are used as inputs to I/Q modulator. As shown in FIG. 1a, the I/Q modulator comprises two baseband-to-RF upconversion mixers with their output signals summed. The I/Q modulator has two baseband inputs and two local oscillator inputs with 90° phase shift between the oscillator inputs ($\cos \omega_l t$ and $\sin \omega_l t$, with $\omega_l$ being the frequency of the local oscillator). The output of the I/Q modulator is an RF signal.

In order to make a complete transmitter, meeting the requirements of a real wireless standard, it may be necessary to include the following components:
  a power amplifier (PA) to increase the output power to the required level;
  a bandpass filter to suppress noise and/or spurious; and
  a power control module to achieve dynamic range capability, through one or more of the following means: 1) power amplifier gain adjustment; 2) variable-gain amplifier gain adjustment; and 3) I/Q modulator output power adjustment.

An example of such a direct upconversion transmitter is shown in FIG. 1b.

Fundamental problems associated with the direct upconversion transmitter using an I/Q modulator are:
1. High-power consumption in the I/Q Modulator block;
2. Non-ideal performance in the analog components within the I/Q modulator, such as the non-linearity of the baseband amplifiers, carrier feed-through due to mismatch effects;
3. Bandwidth limited by analog baseband circuits; and
4. Large die area required for integrating all functions.

Current-steering D/A-converters may solve some the aforementioned problems associated with convention upconversion transmitter. A conventional current-steering D/A-converter comprises a plurality of parallel unit cells divided into two or more sub-blocks, as shown in FIG. 2. In the figure, the converter is presented in a typical segmented configuration, wherein the current in the LSB (least-significant bit) cells is generated with parallel binary weighted units whereas the MSB (most-significant bit) sub-block has a set of unary coded cells. The number of the unary coded cells is ($2^m-1$), where m is the number of bits in the MSB sub-block. Thus, the current for the first bit in the MSB sub-block is generated in one unary coded cell, the current for the second bit in the MSB sub-block is generated in two unary coded cells, and the current for the m bit is generated in $2^{m-1}$ cells. The D/A converter has two current paths for conveying differential currents $I_{out}$ and $I_{xout}$ so that the analog signal output $V_{out}$ can be formed with two external load resistors (not shown).

Typically, each of the parallel unit cells comprises a differential switch pair connected in series to a cascode current source, as shown in FIG. 3. The differential switch pair has two current control paths Q1 and Q2, connected to the output terminals $V_o$ and $V_{xo}$ of the D/A converter. The currents in these paths are controlled by complementary signals $V_{LN+}$ and $V_{LN-}$, which are provided by a digital control logic and are indicative of the value of signal N. The cascode current source has two transistors Q3 and Q4 so as to allow the currents in the cell to be adjusted by DC bias4.

The D/A converters and I/Q modulators are complex and high performance analog elements. The requirement of these analog elements generally limits the flexibility of the RF transmitter.

Ideally a digital radio transmitter is independent of the radio standard and can be used in all of the modulation schemes and signal frequencies. In practice, this requires a D/A converter that is capable of operating at least twice the maximum radio frequency of the used standard. One of the major problems associated with D/A converters for use in RF generation is the high sampling frequency. If an RF signal of 1.8 GHz is generated, the sampling rate in the digital baseband must be at least 3.6 GHz. Furthermore, in order to effectively filter the mirror image component around the frequency difference between the sampling frequency and the digital signal frequency, a much higher sampling rate is needed. A D/A converter with such a high sampling frequency is impractical to implement because of the high price and high power consumption. For that reason, D/A converters are typically used in the baseband or in the low IF range. These converters are used along with high performance analog mixers for RF generation. These I/Q mixers consume easily tens of milliamperes of DC currents. Moreover, even when the D/A converters are used in the baseband and in the IF range, the noise current spikes occur because of the high data rate of hundreds of megahertz. These noise spikes can limit the performance of the RF transmitter.

It is thus advantageous and desirable to provide a cost-effective method and device for carrying out digital-to-analog conversion associated with RF generation. At the same time, the power consumption is reduced.

Yuan (EP1338085) discloses a direct digital amplitude modulator wherein an upconverting type of converter cell is used. In Yuan, a number of sub-switched current source units are switched on or off according to the combinations of the digital input signal and the delayed or non-delayed clock signals to produce or to cancel quantized RF, IF or DC currents and/or voltages at the time precisely controlled by the delayed clock signals. As such, the performance of the circuit is low due to a slow settling of the current in the current source after switching the current source on.

It is advantageous and desirable to provide a method and device for direct digital amplitude modulation wherein the cutting off of the current flow is avoided.

SUMMARY OF THE INVENTION

The present invention uses two digital to RF-conversion devices to convert digital baseband signals into RF signals. The digital-to-RF conversion device combines the D/A conversion function and the upconversion function by a RF-carrier or IF-signal. The device comprises a plurality of parallel unit cells, each of which is a mixer cell type converter having a differential data switch section connected in series to a differential LO-switch pair. The differential LO-switch is further connected in series to a current source. Each unit cell is adapted to receive a control voltage indicative of a data signal value.

Thus, the first aspect of the present invention provides an RF transmitter. The transmitter comprises:

a digital-to-RF converter for converting digital baseband signals into RF signals;

a bandpass filter for filtering the RF signals; and a power amplifier, responsive to the filtered RF signals, for providing amplified signals for transmission, wherein the digital baseband signals comprise a first digital baseband signal and a second digital baseband signal having a phase shift from the first digital baseband signal, each of the first and second digital baseband signals having a plurality of data bits, and wherein the digital-to-RF converter comprises a first conversion component for receiving the first digital baseband signal, and a second conversion component for receiving the second digital baseband signal, each of the first and second conversion components converting the corresponding data bits for providing a differential output signal modulated by a carrier signal, the carrier signal provided between two carrier signal ends, wherein the differential output signal is formed with current loads and provided between two output ends, each of the conversion components comprising:

a plurality of conversion units connected in parallel, each unit adapted to receive a control voltage indicative of a data signal value, the control voltage provided between two control voltage ends, each unit comprising:
   a first differential switch section having:
      two input current paths, each operatively connected to a different one of the output ends; and
      two differential switch pairs connected to the control voltage ends for conveying in the two input current paths differential currents indicative of the data signal value;
   a second differential switch section having two control current paths, each operatively connected in series to a different one of the two differential switch pairs, the control current paths operatively and separately connected to different ones of the carrier signal ends, for modulating the differential currents with the carrier signal; and
   a current source, operatively connected in series to the second differential switch section for further controlling currents in the control current paths.

According to the present invention, the current source comprises at least one current adjusting component having a control terminal, operatively connected to a bias voltage level, for adjusting the current passing through the current adjusting component.

According to the present invention, the second differential switch section comprises two current switching components disposed in different ones of the control current paths, each of the current switching components having a control terminal operatively connected to a different one of the carrier signal ends.

According to the present invention, the first differential switch section comprises a first pair of differential switches and a second pair of differential switches, each pair having two current switches operatively connected to different ones of the control voltage ends.

According to the present invention, the transmitter further comprises:

a variable gain amplifier, responsive to the RF signals, for providing amplified RF signals to the bandpass filter, the bandpass filter providing the filtered RF signals in response to the amplified RF signals.

According to the present invention, the transmitter further comprises a power control module, operatively connected to the digital-to-RF converter for adjusting the output level of the RF signals. The power control module is further operatively connected to the power amplifier for adjusting the power level of the amplified signals for transmission, and operatively connected to the variable again amplifier for adjusting the signal level of the amplified RF signals.

According to the second aspect of the present invention, there is provided a digital to RF-conversion device for converting a digital signal having a plurality of data bits for providing a differential output signal modulated by a carrier signal, the carrier signal provided between two carrier signal ends, wherein the differential output signal is formed with current loads and provided between two output ends. The device comprises:

a plurality of conversion units connected in parallel, each unit adapted to receive a control voltage indicative of a data signal value, the control voltage provided between two control voltage ends, each unit comprising:
   a first differential switch section having:
      two input current paths, each operatively connected to a different one of the output ends; and
      two differential switch pairs connected to the control voltage ends for conveying in the two input current paths differential currents indicative of the data signal value;
   a second differential switch section having two control current paths, each operatively connected in series to a different one of the two differential switch pairs, the control current paths operatively and separately connected to different ones of the carrier signal ends, for modulating the differential currents with the carrier signal; and
   a current source, operatively connected in series to the second differential switch section for further controlling currents in the control current paths.

According to the present invention, the current source comprises at least one current adjusting component having a control terminal, operatively connected to a bias voltage level, for adjusting the current passing through the current adjusting component.

According to the present invention, the second differential switch section comprises two current switching components disposed in different ones of the control current paths, each of the current switching components having a control terminal operatively connected to a different one of the carrier signal ends; and the first differential switch section comprises a first pair of differential switches and a second pair of differential switches, each pair having two current switches operatively connected to different ones of the control voltage ends.

According to the third aspect of the present invention, there is provided a method for direct digital to RF-conversion for converting a digital signal having a plurality of data bits for providing a differential output signal modulated by a carrier signal, the carrier signal provided between two carrier signal ends, wherein the differential output signal is formed with current loads and provided between two output ends. The method comprises the steps of:

1) providing a plurality of conversion units connected in a parallel, each unit adapted to receive a control voltage indicative of a data signal value, the control voltage provided between two control voltage ends, each unit comprising:

a first differential switch section having:
two input current paths, each operatively connected to a different one of the output ends; and
two differential switch pairs connected to the control voltage ends for conveying in the two input current paths differential currents indicative of the data signal value; and a second differential switch section having two control current paths, each of which operatively connected in series to a different one of the two differential switch pairs;

2) operatively and separately connecting the control current paths to different ones of the carrier signal ends, for modulating the differential currents with the carrier signal; and 3) operatively connecting a current source in series to the second differential switch section for further controlling currents in the control current paths.

The invention will become apparent upon reading the description taken in conjunction with FIGS. 4 to 8.

BEST MODE FOR CARRYING OUT THE INVENTION

Figure 1A:
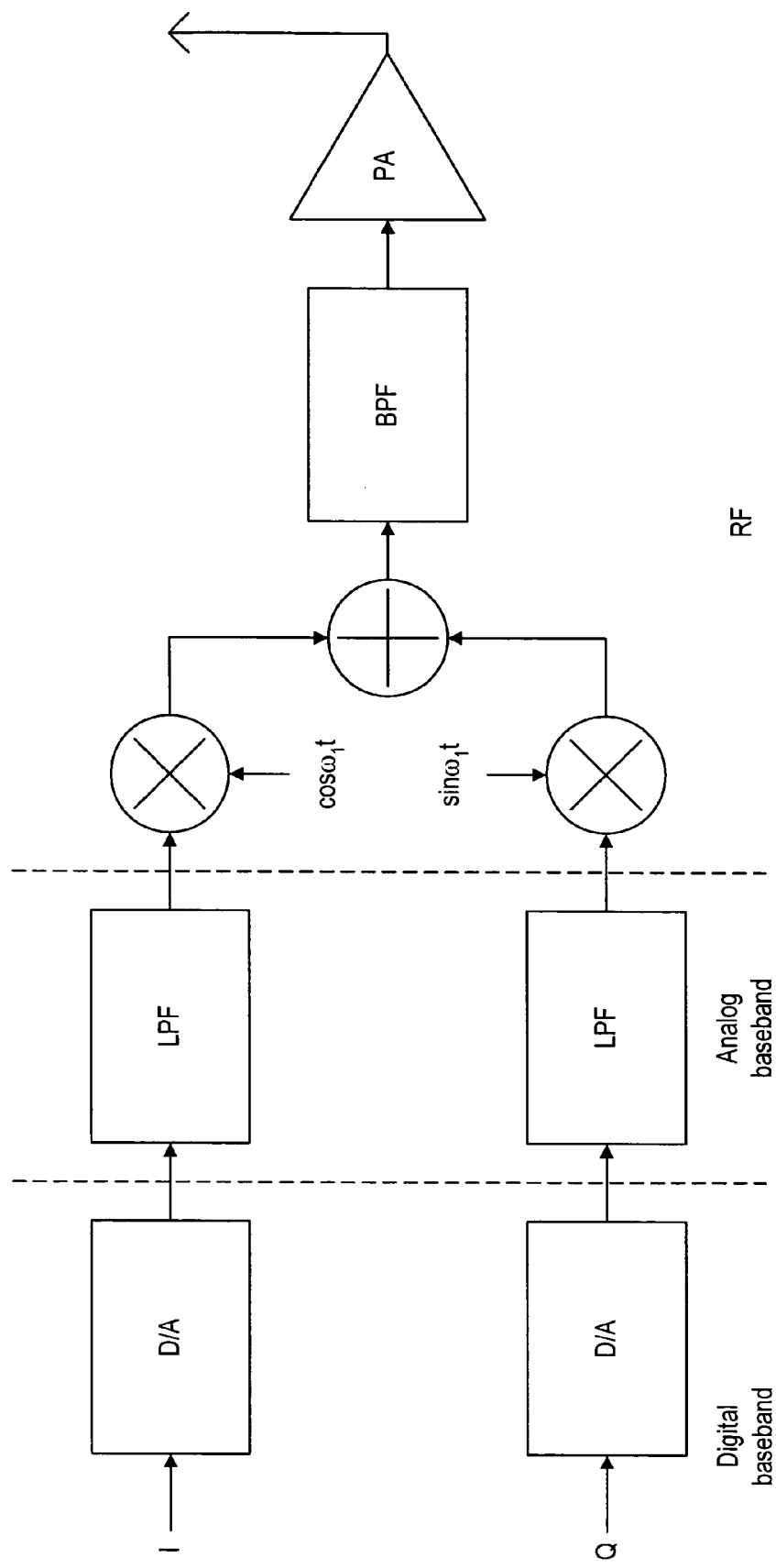
FIG. 1a is a block diagram showing a traditional direct upconversion transmitter.
Figure 1B:
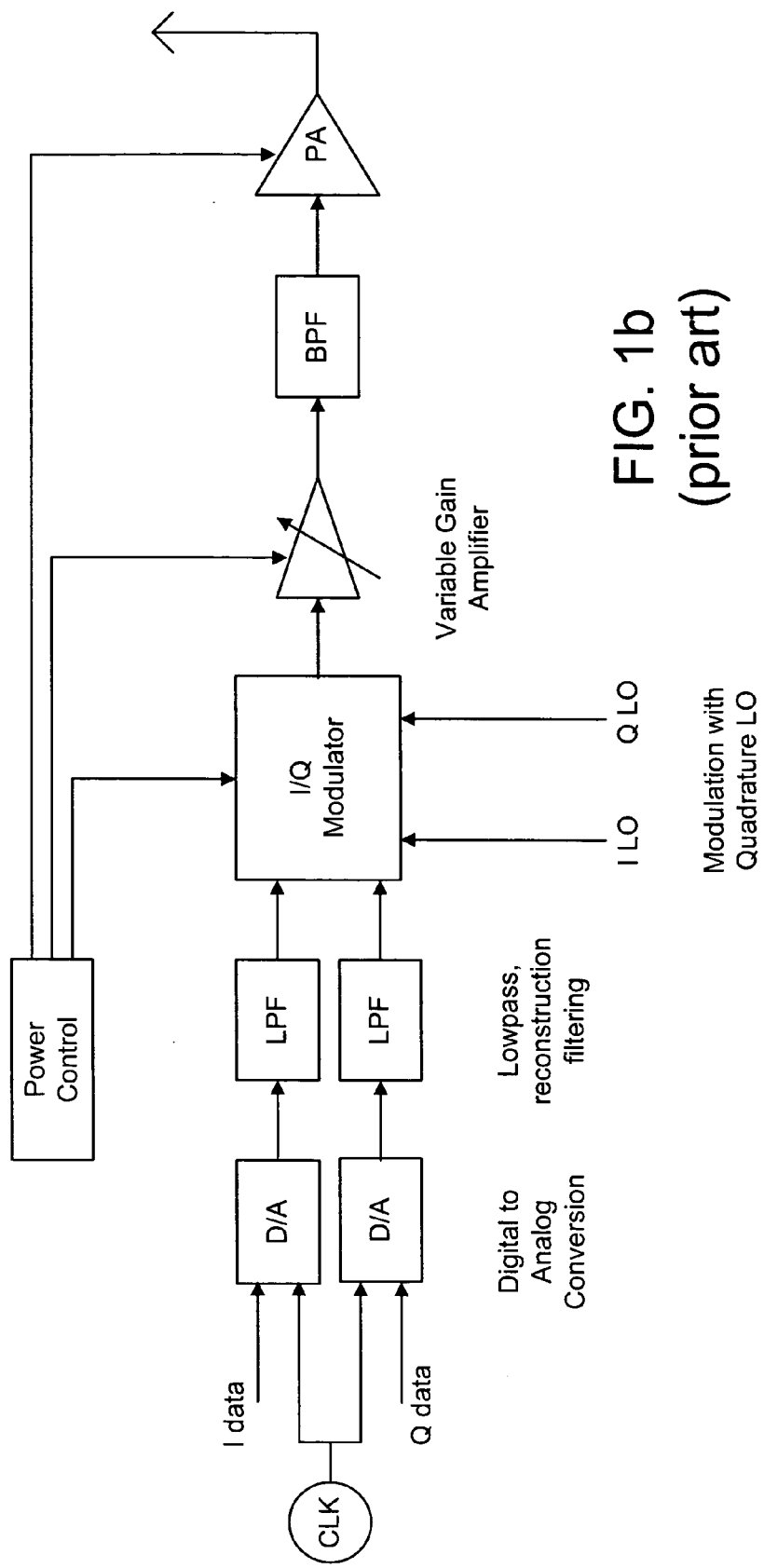
FIG. 1b is a block diagram showing a traditional direct upconversion transmitter with a variable gain amplifier and a power control module.
Figure 2:
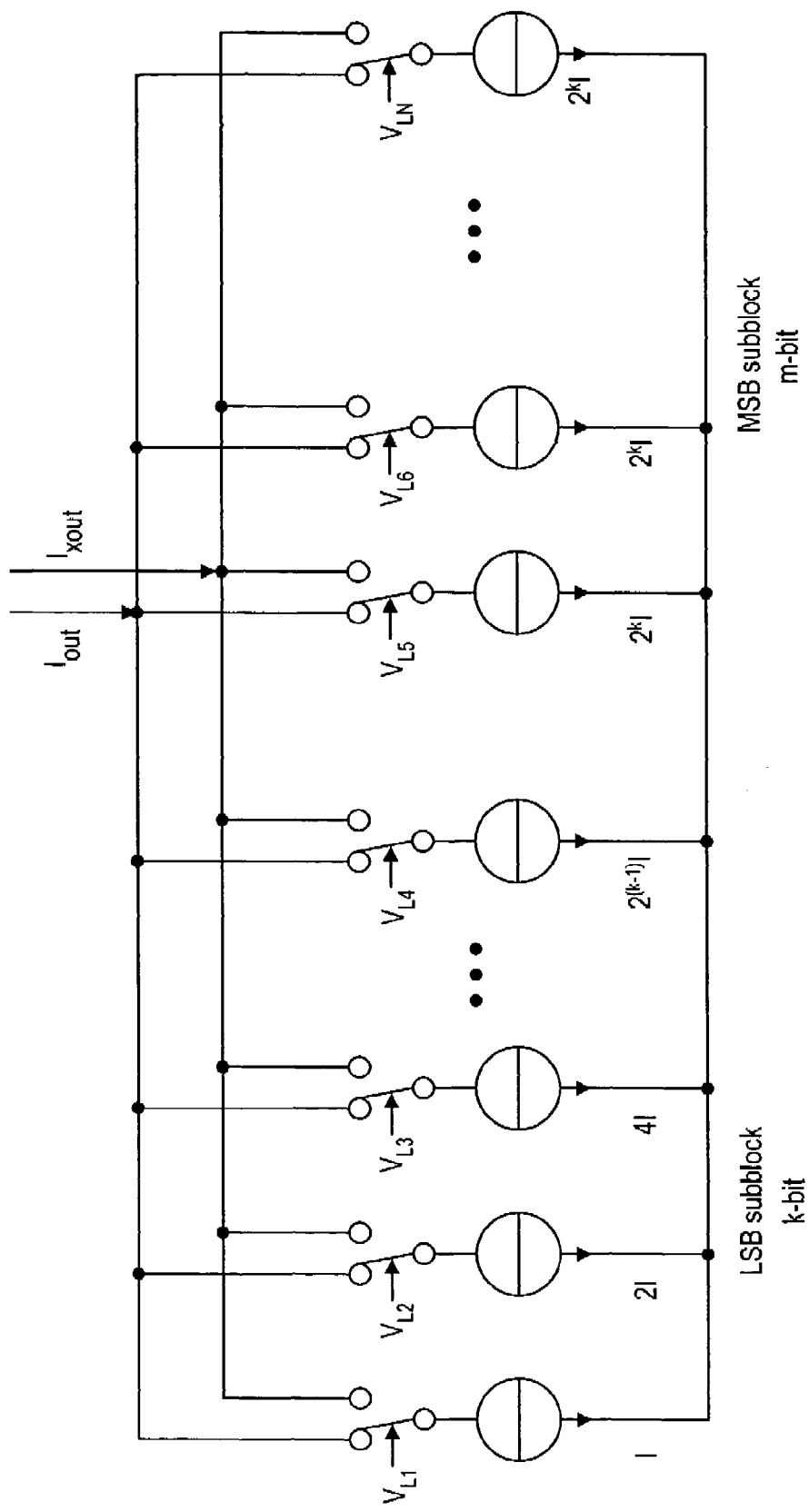
FIG. 2 is a schematic representation illustrating a prior art D/A converter.
Figure 3:
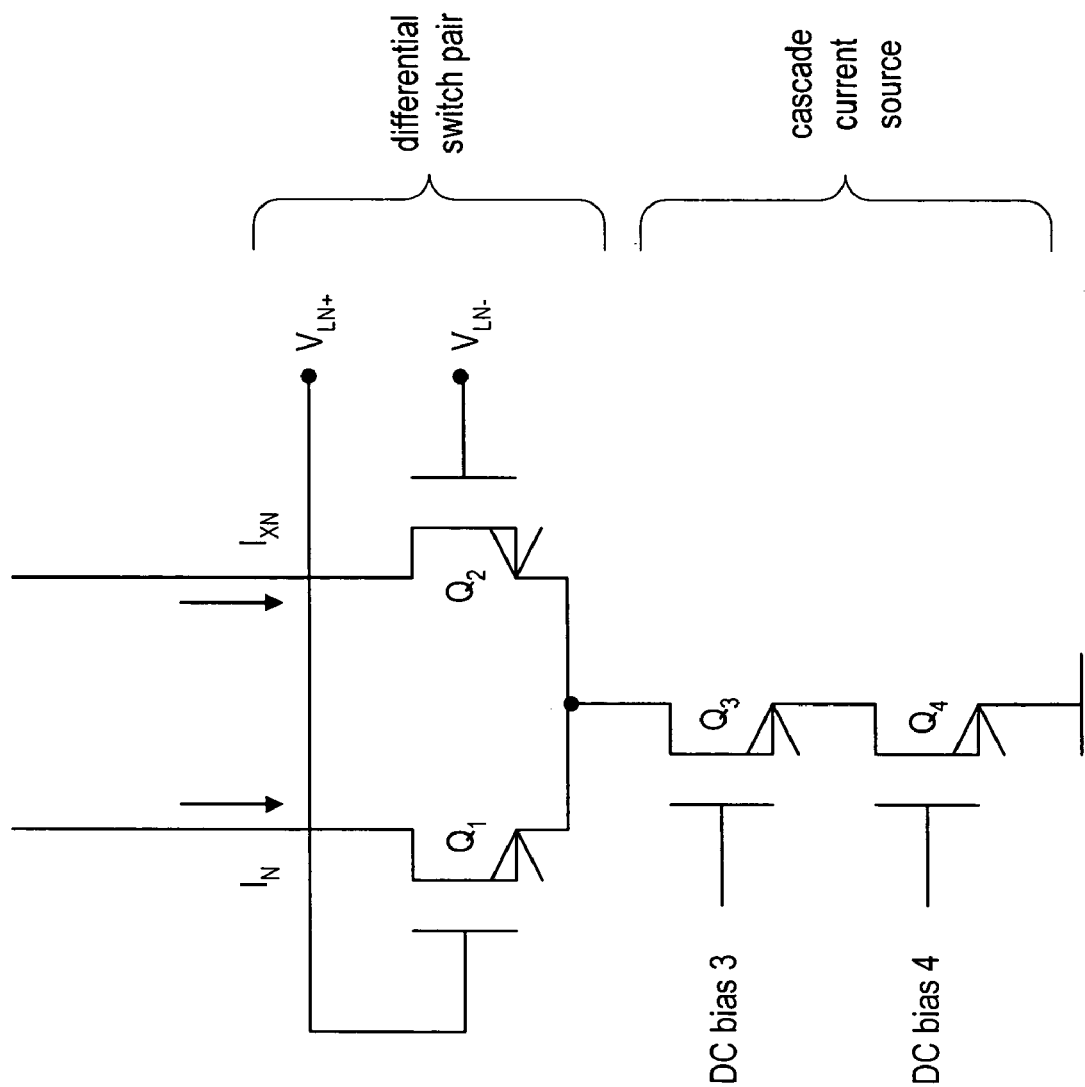
FIG. 3 is a circuitry showing a parallel unit cell in a prior art D/A converter.
Figure 4:
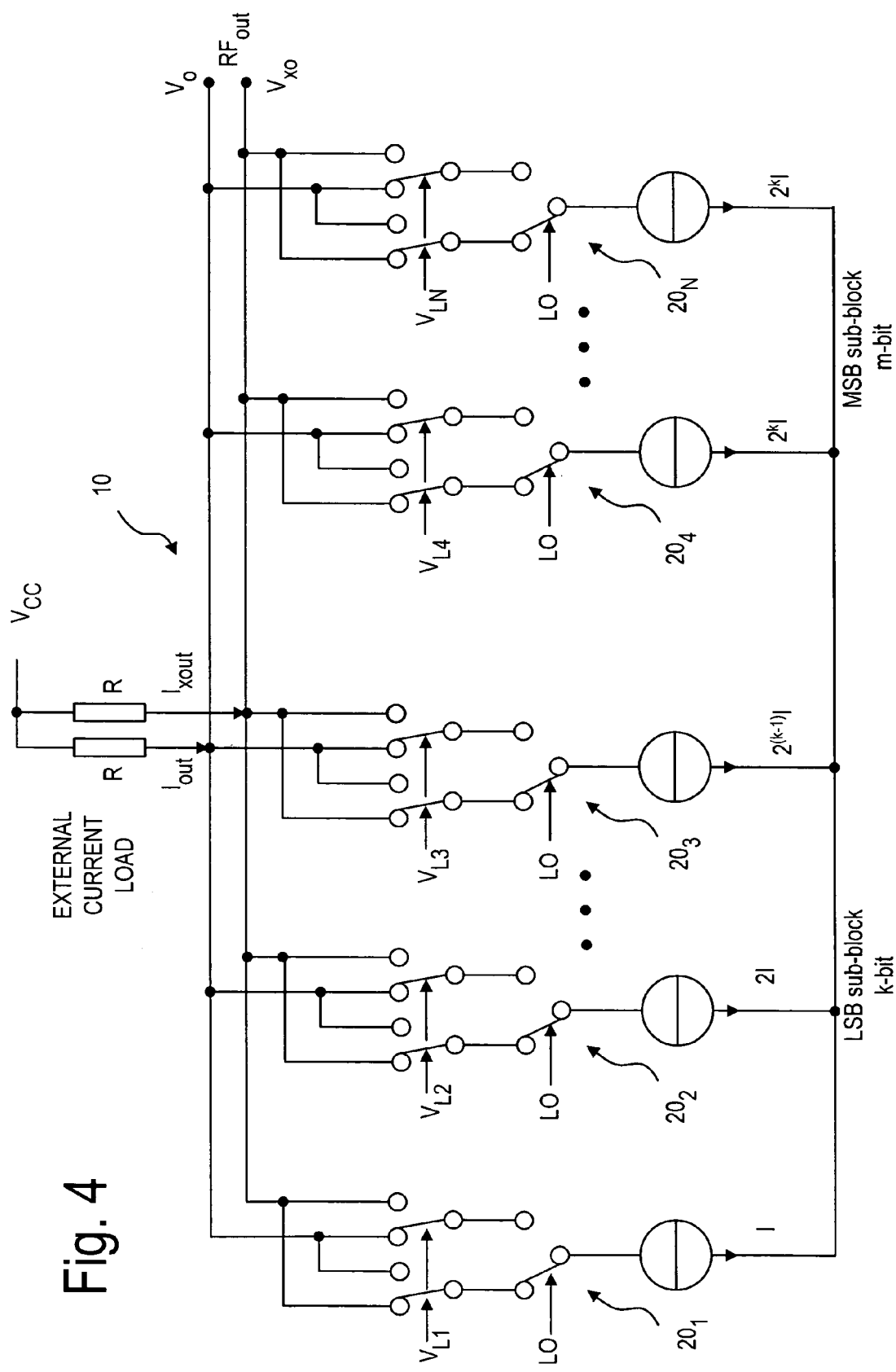
FIG. 4 is a schematic representation illustrating a Digital-to-RF-converter, according to the present invention.

The Digital-to-RF-converter, according to the present invention, combines the D/A conversion function and the upconversion function by a carrier (LO), which can be RF or IF. As shown in FIG. 4, the Digital-to-RF-converter 10 comprises a plurality of parallel unit cells $20_1, 20_2, \ldots,$ $20_N, \ldots$. The upconverter 10 has a segmented configuration, including an LSB sub-block and an MSB sub-block. The current in the LSB sub-block is generated with parallel binary weighted units, whereas the current in the MSB sub-block is generated in a set of unary coded cells. The unary coding can be also used in the LSB sub-block. As with the convention D/A converter shown in FIG. 1, the number of the unary coded cells in the MSB sub-block in the Digital-to-RF-converter 10 is also $2^m-1$, where m is the number of bits in MSB sub-block. The Digital-to-RF-converter 10 has two differential current paths for conveying differential currents $I_{out}$ and $I_{xout}$, so that the modulated output signal, $RF_{out}$, can be formed with two external load resistors, R. The modulated output signal is provided at two terminals $V_o$ and $V_{xo}$. The upconversion is carried out by applying a carrier signal (LO) from a local oscillator to each of the parallel unit cells 20.

Figure 5:
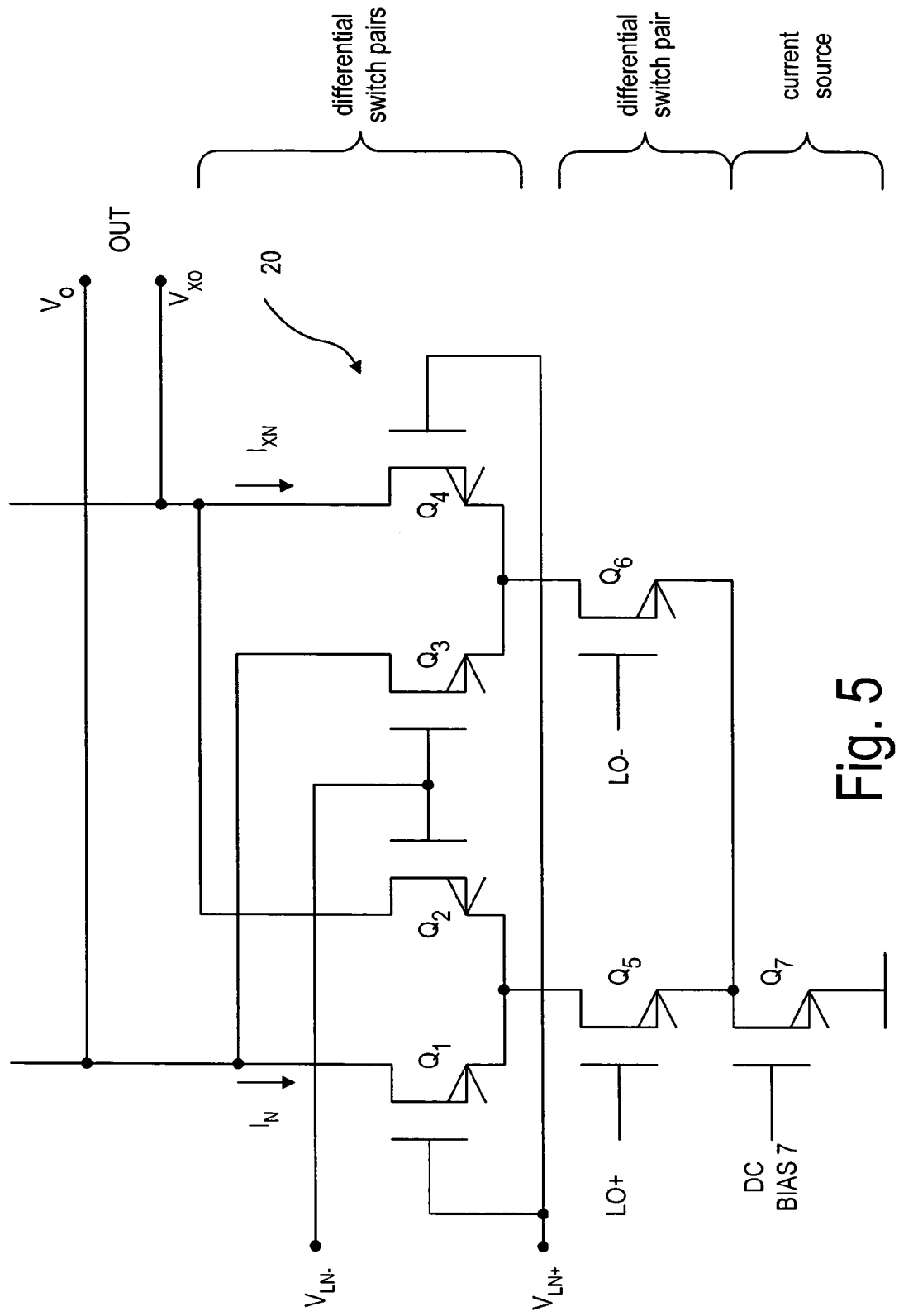
FIG. 5 is a circuitry showing a parallel unit cell in the Digital-to-RF-converter, according to the present invention.

Each of the parallel unit cells 20 is a Gilbert-cell type converter. It comprises a differential data switch section, connected in series with a differential LO-switch pair and a current source, as shown in FIG. 5. The differential data switch section has two differential switch pairs (Q1, Q2) and (Q3, Q4). Each differential data switch pair has two current control paths, $I_N$ and $I_{XN}$, connected to the output terminals $V_o$ and $V_{xo}$. The currents in these paths are controlled by complementary signals $V_{LN+}$ and $V_{LN-}$, which are provided by a digital control logic (not shown) and are indicative of the value of signal N. As shown in FIG. 5, the control voltage $V_{LN+}$ is used to control the currents in Q1 and Q4, and the control voltage $V_{LN-}$ is used to control the currents in Q2 and Q3. Accordingly, the current path Q1 is connected in parallel to the current path Q3. Likewise, the current path Q2 is connected in parallel to the current path Q4.

Each of the differential data switch pairs is connected in series to a differential LO switches Q5 or Q6 so that the differential signals LO+ and LO- from the local oscillator (LO in FIG. 4) can be used to modulate the current in the differential data switch pairs. The differential LO switch formed with Q5 and Q6 is connected in series to the current source Q7, so as to allow the currents generated in the cell 20 to be adjusted by DC bias7.

It should be noted that Q1 to Q7 depicted in FIG. 5 are MOS transistors, but any one of them can be replaced with other type of transistors.

Figure 6:
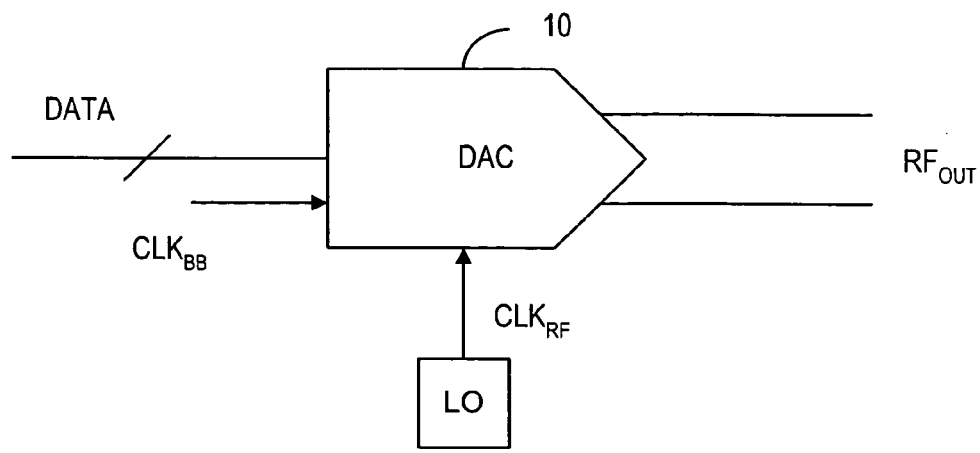
FIG. 6 is a function block diagram showing the input and output signals in relation with the Digital-to-RF-converter.

FIG. 6 is a functional block diagram of the D/A upconverter 10. In the figure, DATA is the data from the digital baseband, $CLK_{BB}$ is the sampling clock, and $CLK_{RF}$ is the signal from an LO.

Figure 7:
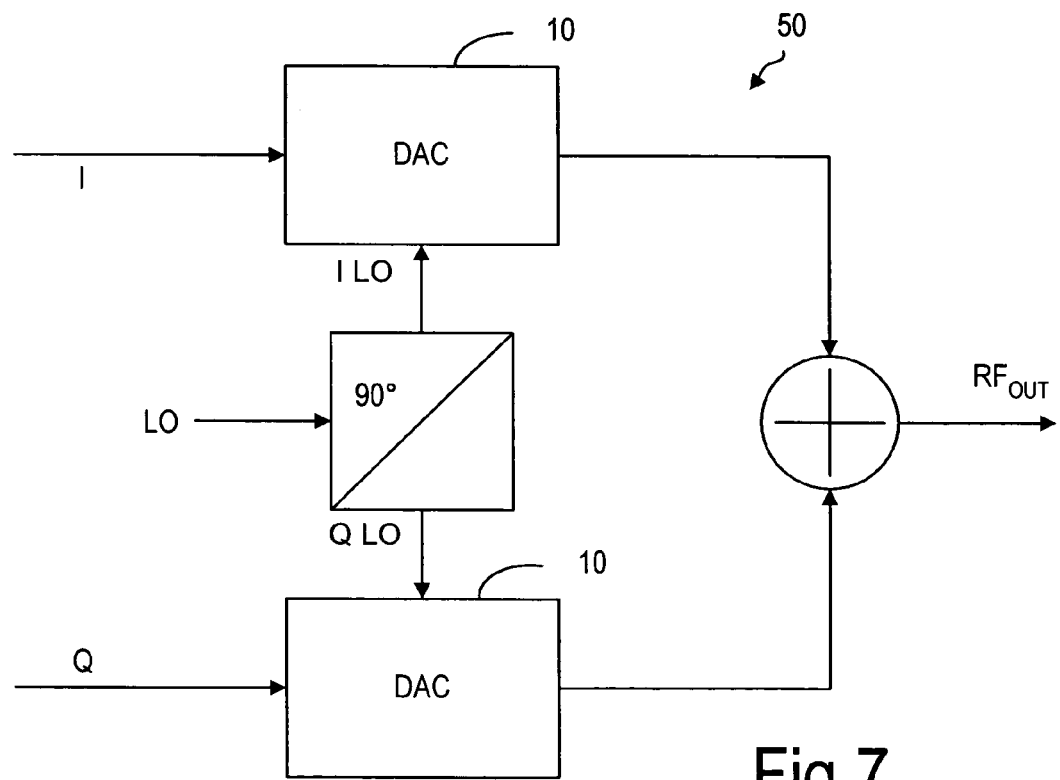
FIG. 7 is a block diagram showing a circuitry for suppressing mirror components in an upconverted signal.

It should be noted that, in direct digital-to-RF conversion, image components are generated by the D/A-conversion function to $f_{CLK,RF} \pm n*(f_{CLK,BB} \pm f_{signal})$, where $f_{CLK,RF}$ is the frequency of the LO signal, n is a positive integer, $f_{CLK,BB}$ is the sampling frequency and $f_{signal}$ is the frequency of the digital data. Furthermore, the SINC-function of the D/A-conversion generates a notch to $f_{CLK,RF} \pm n*f_{CLK,BB}$. If the narrow band digital data is generated to baseband (0 Hz), the image frequency of the D/A-conversion function falls to the notch of the SINC-function and the image components are significantly reduced. The image components of the upconversion function in the RF output signal can be suppressed by using an I/Q modulator architecture 50, as shown in FIG. 7. In this image rejection architecture, two D/A upconverters 10 are used to upconvert the digital data.

Figure 8:
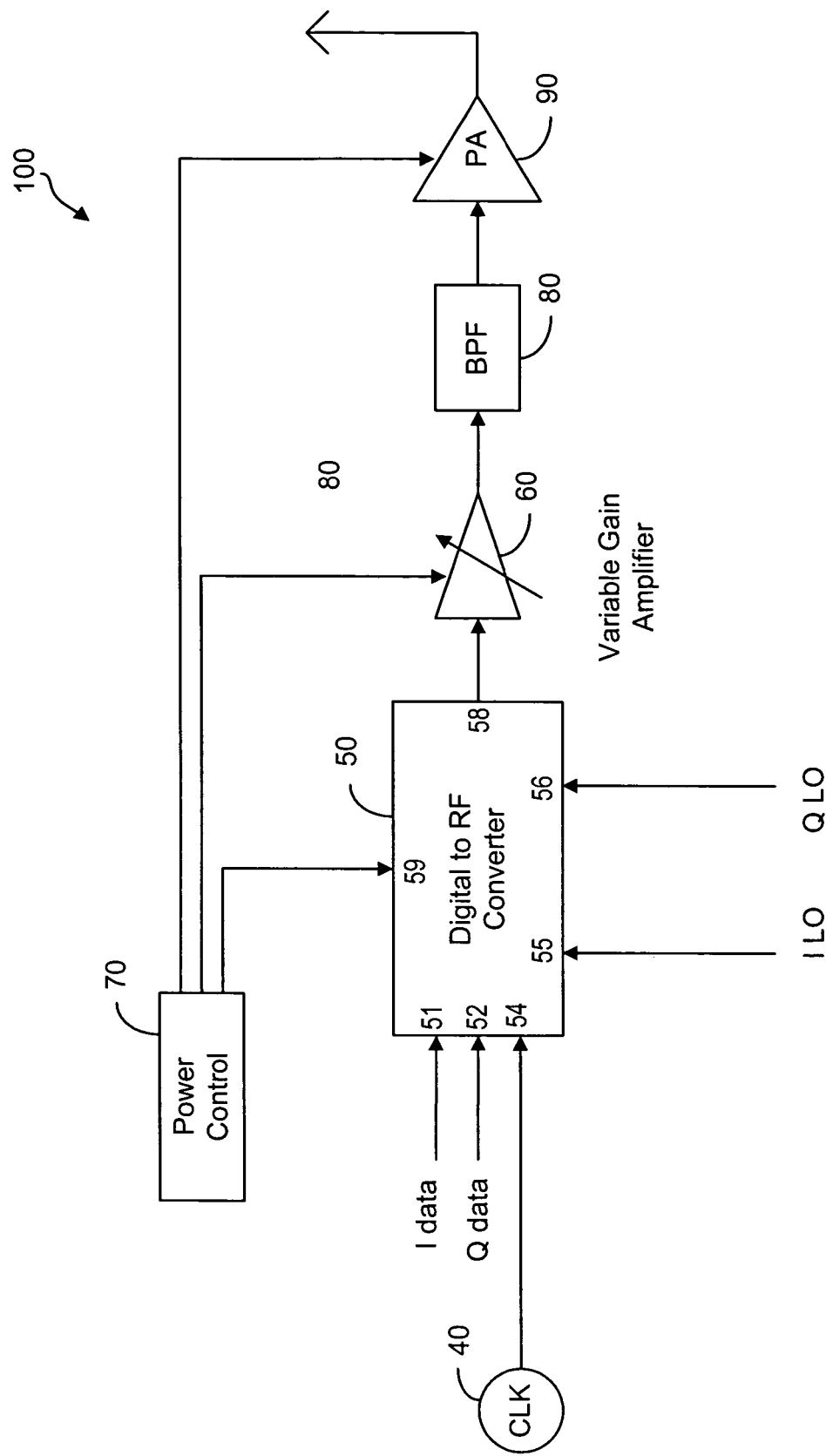
FIG. 8 is a block diagram showing a direct upconversion transmitter, according to the present invention.

The direct upconversion transmitter with digital-to-RF converter, according to the present invention, is shown in FIG. 8. As shown, the transmitter 100 comprises a digital-to-RF converter 50 which has two baseband inputs 51, 52 to accept I and Q digital baseband signals, a clock input 54 to receive clock signals from a baseband frequency generator 40. The I and Q digital baseband signals are passed directly to two D/A converters 10 (see FIGS. 4 and 7). The digital-to-RF converter 50 also has two local oscillator inputs 55, 56 for receiving I and Q LO signals. The I and Q LO signals are conveyed to the corresponding D/A converters 10 for RF upconversion. The transmitter 100 further comprises a variable gain amplifier 60, a bandpass filter 80, and a power amplifier 90. In order to meet the requirement of a wireless standard, a power control module 70 is operatively connected to the digital-to-RF converter 50, the variable gain amplifier 60 and the power amplifier 90 so as to adjust the gain of the power amplifier 90, the gain of the variable gain amplifier 60 and the output level of the RF signals at output 58.

The advantages of the present invention include:
1. Substantially eliminating analog signal processing in the D/A upconverters, in the lowpass reconstruction filter and the I/Q modulator baseband amplifiers;
2. Reducing non-ideal effects when compared to conventional I/Q modulators, resulting in improved linearity in baseband signal amplification, improved bandwidth, improved image dependency, and improved carrier feed-through;
3. Reduction in current consumption; and
4. Reduction in product cost due to die area reduction.

Although the invention has been described with respect to a preferred embodiment thereof, it will be understood by those skilled in the art that the foregoing and various other changes, omissions and deviations in the form and detail thereof may be made without departing from the scope of this invention.

What is claimed is:

1. An RF transmitter, comprising:
   a digital-to-RF converter for converting digital baseband signals into RF signals;
   a bandpass filter for filtering the RF signals; and
   a power amplifier, responsive to the filtered RF signals, for providing amplified signals for transmission, wherein the digital baseband signals comprise a first digital baseband signal and a second digital baseband signal having a phase shift from the first digital baseband signal, each of the first and second digital baseband signals having a plurality of data bits, and wherein the digital-to-RF converter comprises a first conversion component for receiving the first digital baseband signal, and a second conversion component for receiving the second digital baseband signal, each of the first and second conversion components converting the corresponding data bits for providing a differential output signal modulated by a carrier signal, the carrier signal provided between two carrier signal ends, wherein the differential output signal is formed with current loads and provided between two output ends, each of the conversion components comprising:
   a plurality of conversion units connected in parallel, each unit adapted to receive a control voltage indicative of a data signal value, the control voltage provided between two control voltage ends, each unit comprising:
   a first differential switch section having:
   two input current paths, each operatively connected to a different one of the output ends; and
   two differential switch pairs connected to the control voltage ends for conveying in the two input current paths differential currents indicative of the data signal value;
   a second differential switch section having two control current paths, each operatively connected in series to a different one of the two differential switch pairs, the control current paths operatively and separately connected to different ones of the carrier signal ends, for modulating the differential currents with the carrier signal; and
   a current source, operatively connected in series to the second differential switch section for further controlling currents in the control current paths.

2. The RF transmitter of claim 1, wherein the current source comprises at least one current adjusting component having a control terminal, operatively connected to a bias voltage level, for adjusting the current passing through the current adjusting component.

3. The RF transmitter of claim 1, wherein the second differential switch section comprises two current switching components disposed in different ones of the control current paths, each of the current switching components having a control terminal operatively connected to a different one of the carrier signal ends.

4. The RF transmitter of claim 1, wherein the first differential switch section comprises a first pair of differential switches and a second pair of differential switches, each pair having two current switches operatively connected to different ones of the control voltage ends.

5. The RF transmitter of claim 1, further comprising:
   a variable gain amplifier, responsive to the RF signals, for providing amplified RF signals to the bandpass filter, the bandpass filter providing the filtered RF signals in response to the amplified RF signals.

6. The RF transmitter of claim 1, further comprising a power control module, operatively connected to the digital-to-RF converter for adjusting the output level of the RF signals.

7. The RF transmitter of claim 1, further comprising a power control module, operatively connected to the power amplifier for adjusting the power level of the amplified signals for transmission.

8. The RF transmitter of claim 5, further comprising a power control module, operatively connected to the variable again amplifier for adjusting the signal level of the amplified RF signals.

* * * * *